United States Patent [19]
Jacobson et al.

[11] Patent Number: 6,072,716
[45] Date of Patent: Jun. 6, 2000

[54] MEMORY STRUCTURES AND METHODS OF MAKING SAME

[75] Inventors: Joseph M. Jacobson, Newton; Brian N. Hubert, Cambridge, both of Mass.

[73] Assignee: Massachusetts Institute of Technology, Cambridge, Mass.

[21] Appl. No.: 09/291,801

[22] Filed: Apr. 14, 1999

[51] Int. Cl.[7] .................................................. G11C 11/00
[52] U.S. Cl. ........................ 365/163; 365/148; 365/153
[58] Field of Search .................................... 365/163, 153, 365/158, 159, 71, 148

[56] References Cited

U.S. PATENT DOCUMENTS

| | | | |
|---|---|---|---|
| 5,363,329 | 11/1994 | Troyan | 365/163 |
| 5,920,788 | 7/1999 | Reinberg | 365/163 |

OTHER PUBLICATIONS

K.C. Park and S. Basavaiah, Proceedings of the Symposium on Semiconductor Effects in Amorphous Solids, pp. 284–333 (1970).

P.O. Sliva, G. Dir, and C. Griffiths, Proceedings of the Symposium on Semiconductor Effects in Amorphous Solids, pp. 316–333 (1970).

D.P. Oxley, "Memory Effects in Oxide Films", Oxides and Oxide Films, The Anodic Behavior of Metals and Semiconductors Series, vol. 6, pp. 251–322 (1981).

J.R. Heath, P.J. Kuekes, G.S. Snider, and R.S. Williams, "A Defect–Tolerant Computer Architecture: Opportunities for Nanotechnology," Science, vol. 280, pp. 1716–1721 (1998).

*Primary Examiner*—Vu A. Le
*Attorney, Agent, or Firm*—Cesari and McKenna, LLP

[57] ABSTRACT

Electrically erasable and rewritable memory structures with reversible states and good retention times may be constructed on flexible substrates using simple room-temperature deposition (e.g., printing) processes and curing temperatures below 110° C. The memory structures are based on a polymer matrix having dispersed therein a particulate conductive or semiconductive material. When electrodes of suitable composition and geometry are used to apply electrical pulses of opposite polarity to the matrix material, reversible memory switching behavior is observed. In particular, subjection to positive or negative voltage pulses causes the devices to make fully-reversible transitions between low-resistance and high-resistance states.

27 Claims, 3 Drawing Sheets

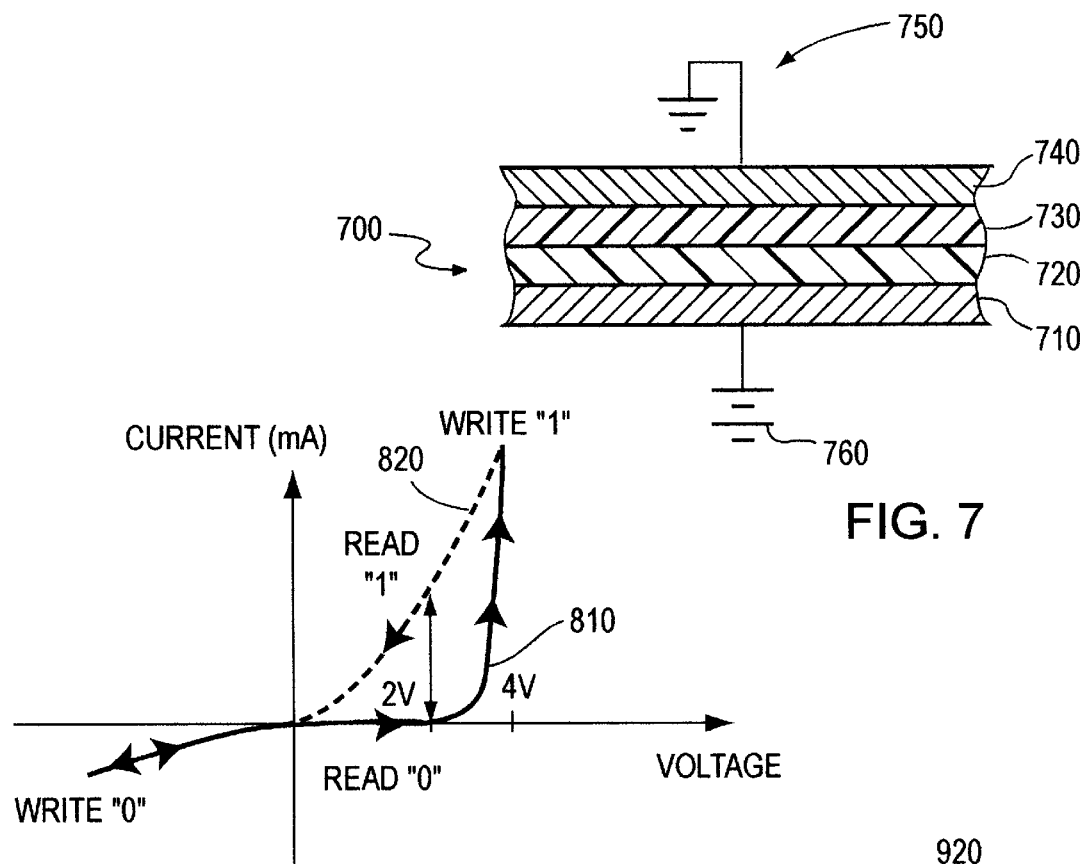
FIG. 7
FIG. 8
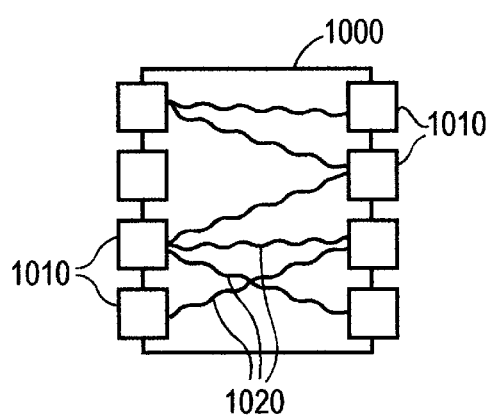
FIG. 9
FIG. 10

MEMORY STRUCTURES AND METHODS OF MAKING SAME

FIELD OF THE INVENTION

The present invention relates to recording of information, and in particular to electrically erasable and rewritable memory switching devices.

BACKGROUND OF THE INVENTION

In recent years considerable effort has been devoted to the study of voltage- and current-controlled bistable switching elements fabricated from amorphous or polycrystalline materials, e.g., for use in data storage devices. These elements transition from a high-resistance state to a low-resistance state in times on the order of microseconds to milliseconds when subjected to a threshold value of current or voltage. Some such devices exhibit zero-bias memory retention, meaning that preservation of the low-resistance state does not require the presence of a holding voltage or current. Zero-bias devices may utilize any of a number of materials known to exhibit bistable impedance with dual conductance states, the most important of these being amorphous semiconducting glasses and amorphous metal oxides.

Amorphous semiconducting glasses (most successfully, chalcogenide glasses) have been used to create non-volatile memory devices. These memory switches are amorphous and can be produced on non-crystalline substrates. Moreover, chalcogenide switches are "radiation-hard," making them attractive for particular applications. In the mid-1970s, a 256-bit, non-volatile, electronically alterable memory (so-called "Ovonic memory") was marketed by Energy Conservation Devices as a device to fill the large gap between volatile alterable random access memory (RAM) and non-volatile, non-alterable read-only memory (ROM). However, interest in glass switches has waned considerably since that time due to the need for expensive manufacturing processes and the complicated pulse trains required to store data. Ultimately, memory switch devices were at a distinct disadvantage when pitted against competing technologies such as electronically erasable programmable read-only memories (EEPROMs).

Metal oxide memory structures—also known as oxide switches—are typically metal-oxide-metal sandwiches. Alternatively, coplanar metal-insulator-metal (MIM) structures can be formed. Metal layers are commonly laid down by vacuum evaporation through masks at pressures less than $10^{-5}$ torr. Precision oxidation of the metal is carried out by any of numerous methods including plasma discharge, thermal oxidation, and anodic processes. Switching and negative-resistance behavior in metal oxides has been reported for nickel oxide, aluminum oxide, titanium dioxide, niobium oxide, and zirconium dioxide, among others. However, the switching behavior of such devices is highly dependent upon oxide thickness and electrode deposition methods. Moreover, nearly all metal-oxide switch devices are susceptible to catastrophic failure in the presence of pinhole defects in the insulator.

DESCRIPTION OF THE INVENTION

1. Objects of the Invention

It is, accordingly, an object of the present invention to provide a memory switch with desirable performance characteristics that can be fabricated using methods more easily implemented than those typically employed to fabricate semiconducting-glass and metal-oxide memory devices.

Another object of the invention is to provide a memory switch that can be fabricated on a flexible substrate and then subjected to some degree of flexing without appreciable effect on memory performance.

Still another object of the invention is to provide a memory switch useful in the construction of a programmable interconnect.

A further object of the invention is is to provide a memory switch useful in the construction of a printed computer.

2. Brief Summary of the Invention

To achieve the foregoing and other objects, the present invention provides an information-recording medium based on a polymer matrix having dispersed therein a particulate conductive or semiconductive material. When electrical pulses of opposite polarity are applied to the matrix material by electrodes of suitable composition and geometry, reversible memory switching behavior is observed. In particular, subjection to positive or negative voltage pulses causes the devices to make fully-reversible transitions between low-resistance and high-resistance states. The material will hysteretically persist in the set state even after the voltage source is deactivated. Moreover, these matrix films can be deposited onto rigid or flexible substrates using convenient processes like screen printing, block printing, painting, spin coating, and the like.

In general, the dispersed particulate material has an average size no greater than 50 $\mu$m, and is dispersed in a plastic resin. Suitable resins include methacrylic resins, polyester resins, polycarbonate resins, vinyl chloride resins, polyamide resins, polyethylene resins, polypropylene resins, polystyrene resins, and silicone resins.

In one embodiment, the memory device utilizes carbon pigment (e.g., carbon black or graphite) dispersed in a polymeric carrier and applied to an aluminum base. Retention times on the order of several hundred hours have been demonstrated with such devices mounted to flexible substrates. In other embodiments, the dispersed phase is highly doped silicon.

Memory systems using these materials may take the form of novel structures such as three-dimensional stacked memory arrays for ultra-high density data storage, and non-volatile state switches for computer systems fabricated entirely by printing. Furthermore, printed memory elements with less than 100% yield may be assembled into defect-tolerant architectures to create powerful, massively parallel, cost-efficient computing devices.

BRIEF DESCRIPTION OF THE DRAWINGS

The foregoing discussion will be understood more readily from the following detailed description of the invention, when taken in conjunction with the accompanying drawings, in which:

FIG. 7 shows a vertical cross-section through a four-layer memory device having a silicon-polymer memory film and a silver-in-polymer conductive ink film sandwiched between foil electrodes (and illustrated in a vertical configuration);

FIG. 8 shows a typical current-voltage curve and read/write operations for a memory device as shown in FIG. 8;

FIG. 9 is a plan view of a planar memory array utilizing memory elements in accordance with the invention; and FIG. 10 illustrates use of the memory elements of the present invention in conjunction with logic elements.

DETAILED DESCRIPTION OF THE PREFERRED EMBODIMENTS

Figure 1:
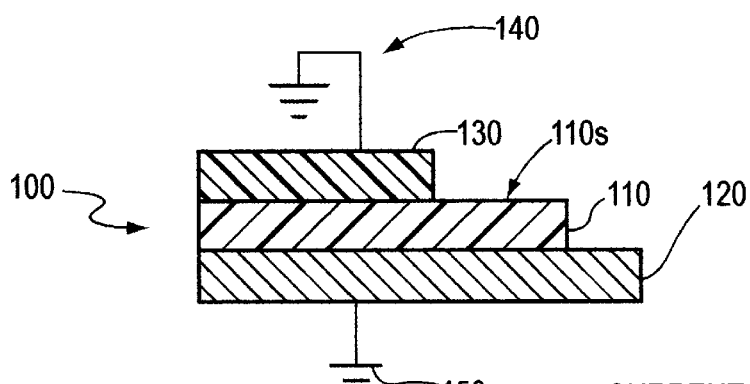
FIG. 1 shows a vertical cross-section through a three-layer carbon-polymer memory device in which a carbon-polymer memory film is sandwiched between aluminum and non-aluminum electrodes in a configuration arbitrarily illustrated vertically.

The first embodiment of the present invention utilizes a carbon-based memory film between two electrodes to form an information-recording medium. With reference to FIG. 1, a memory device may be constructed as a three-layer, two-terminal element in a layered configuration illustrated vertically. A carbon-polymer film 110 is thinly deposited onto an aluminum or aluminized anode 120 (to a thickness ranging from a few microns to tens of microns), and is then thermally cured in place. Film deposition can be accomplished by painting, screen printing, jetting, or otherwise applying a flowable composition that behaves as an ink until cured. Thus, the carbon-polymer film 110 may be, for example, carbon black or graphite dispersed in a suitable carrier. A carbon black-based ink can be made by mixing carbon black particulates with a plastic resin such as polyester (Acheson no. SS 24112, for example) or vinyl resin (Acheson no. 23DD146A, for example) in a weight ratio ranging from 1:3 to 1:10. A graphite-based ink can be made by mixing graphite-in-vinyl conductive ink (Acheson no. 440B, for example) with additional amounts of vinyl resin (Acheson no. 23DD146A, for example) in a weight or volume ratio ranging from 1:3 to 1:10.

Following deposition, either of these inks can be cured into a film by heating at 107° C. for 15 min. Memory device 110 is completed by application of a non-aluminum cathode 130 to the upper surface 110s of memory film 110. For example, various conducting inks can be used as the top contact 130 including silver-in-vinyl (Acheson no. 725A), silver-in-polyester (Acheson no. 479 SS), indium-tin-oxide-in-polyester (Acheson no. SS 24823), indium-tin-oxide-in-vinyl, carbon-in-vinyl (e.g., graphite-in-vinyl, Acheson no. 440B) and carbon-in-polyester compositions. The top contact 130 is cured in place and serves to make the device 100 substantially pressure insensitive.

In a preferred embodiment, the carbon-polymer film 110 is a mixture of carbon black particulates and polyester in a weight ratio of 1:6, and the conducting-ink top contact 130 is silver in polyester. In a typical configuration, a voltage source 150 is connected to the aluminum or aluminized substrate 120, and the top contact 130 is connected to electric ground as indicated at 140. Alternatively, electrical contact to the upper surface 110s of memory film 110 can be achieved using a grounded conducting probe or other electrode material that does not contain aluminum.

Figure 2:
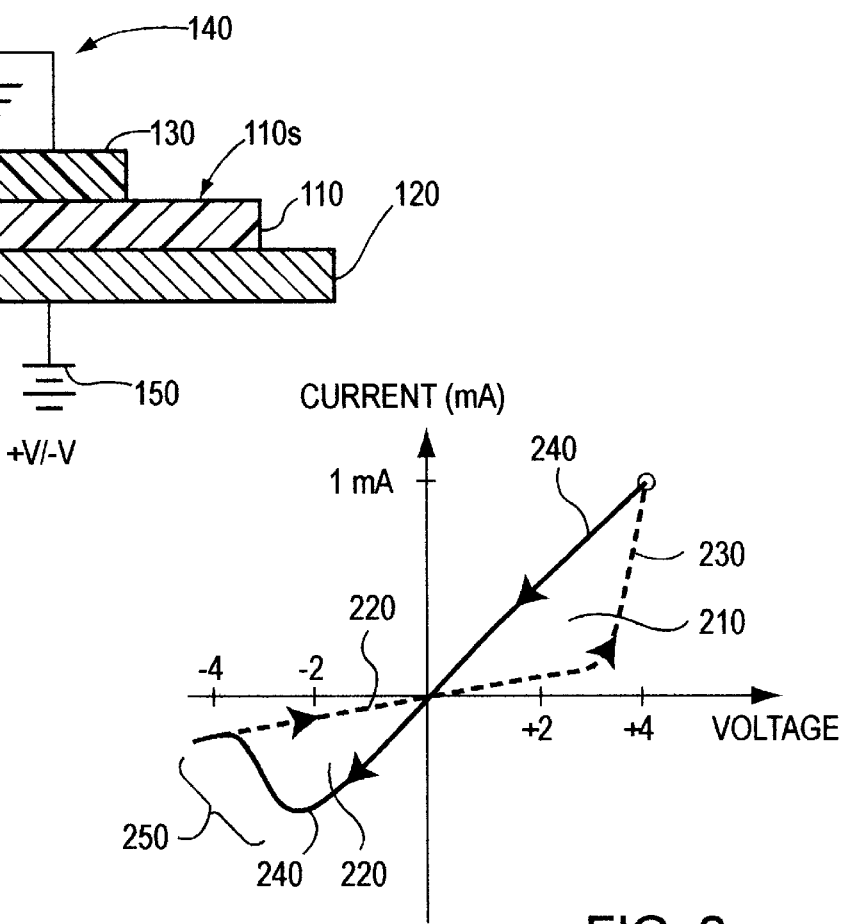
FIG. 2 shows a typical current-voltage curve for a memory device as shown in FIG. 1 and utilizing aluminum and silver-ink electrodes.

Like many metal-oxide memory switches reported in the literature, carbon-polymer devices exhibit "forming" phenomena, whereby the positive threshold voltage required to switch the device for the first time is greater than that needed for subsequent switching events. FIG. 2 shows a typical current-voltage curve for a memory device in accordance herewith having a carbon-polymer memory film 110 sandwiched between an aluminum electrode 120 and a silver ink electrode 130 (in the vertical configuration shown in FIG. 1). The I-V curve reveals large hysteresis and negative resistance characteristics at relatively low voltage potentials. Without being bound to any particular theory or mechanism, it is believed that the junction between the carbon-polymer film and the silver ink electrode is primarily responsible for the shape of the positive end 210 of the hysteresis curve, while the junction between the aluminum substrate and the carbon-polymer film is responsible for the profile of the negative end 220 of the hysteresis curve. Depending on the chosen ratio of carbon to polymer in the active film, maximum current may range from tens of microamps (for high polymer content) to hundreds of milliamps (for high carbon content). All hysteresis effects are lost when the carbon black or graphite content becomes too low or too high.

With continued reference to FIG. 2, the high-resistance state line 230 is dotted with arrows pointing to the right. The low-resistance state line 240 appears as a solid line with arrows pointing to the left. The switch from the high-resistance state to the low-resistance state is accomplished by exceeding a positive threshold voltage of about +2.0 volts across the memory film, wherein positive voltage is defined in terms of the potential of the aluminum substrate 120 relative to the grounded top contact 130. Maximum conversion to the low-resistance state is accomplished by driving the voltage to about twice the threshold value (i.e., about +4.0 volts).

The switch from the low-resistance state to the high-resistance state is initiated by exceeding a negative threshold voltage of about −2.0 volts, with full conversion occurring at slightly more than twice that value at about −4.0 volts. The most notable feature at the negative end of the I-V curve is the negative resistance path 250 from −2.0 volts to −4.0 volts. The carbon-polymer memory film is inherently sensitive to contact pressure when contacted with a probe and passes more current as probe pressure is increased. Pressure sensitivity is still apparent for devices with indium-tin-oxide-in-polyester and graphite-in-vinyl ink top contacts 130. However, pressure sensitivity is completely eliminated by application of more highly conductive silver-in-vinyl or silver-in-polyester top contacts 130, even for contacts as small as 750 μm in diameter. A silver ink top contact 130 also serves to prevent degradation of hysteresis after write-read cycling. Indeed, more than 43,000 write cycles at 50 Hz have been applied to such a memory device with minimal degradation of the hysteresis curve.

The magnitude of the hysteresis is critically dependent on choice of substrate material, and is observed to substantially increase when an aluminum or aluminized substrate is used as at least one of the electrodes of the memory device. Various compositions of carbon-polymer films have been deposited onto conductive substrates of aluminum foil, aluminized mylar, oxidized aluminum (heated at 350° C. in air for 12 h), tantalum, indium, tungsten, mylar-backed copper foil, silver-in-vinyl ink on glass, silver-in-polyester ink on glass, and indium-tin-oxide-in-polyester ink on glass. Of these, only the substrates formed from aluminum, tantalum, and their alloys were found to exhibit any appreciable hysteresis with the carbon-polymer matrix. The remainder showed linearly resistive characteristics.

Figure 3:
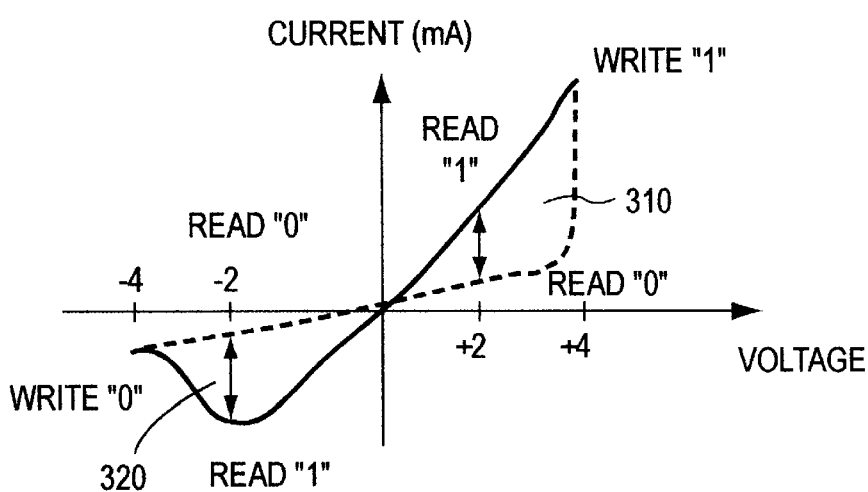
FIG. 3 shows a typical current-voltage curve and read/write operations for such a memory device.

In a representative read-write operation, a '1' bit is written to the memory film described in connection with FIG. 2 by applying thereto a positive voltage step pulse of +4.0 volts for a specified duration (ranging from microseconds to milliseconds) to cause a switch to the low-resistance state, which is arbitrarily defined herein as '1'. As noted above, full conversion to the '1' state generally requires that the magnitude of this pulse be twice the observed positive threshold voltage. Writing a '0' bit to the memory element is accomplished by applying a negative voltage pulse of −4.0 volts for a specified duration (also ranging from microseconds to milliseconds) to cause a switch to the high-resistance state, which is arbitrarily defined herein as '0'. With reference to FIG. 3, reading of the '1' or '0' state can be performed at either the positive end 310 or the negative end 320 of the hysteresis curve. At the positive end 310 of the curve, reading the '1' or '0' state is performed by applying a positive voltage pulse with a magnitude approximately half that of the write '1' voltage while observing the current level through the device. In this case, +2.0 volts is applied. High current indicates that the memory device is in the low-resistance state and therefore a '1' has been stored, while low current indicates that that the memory device is in the high-resistance state and therefore a '0' has been stored. The memory device can be subjected to a virtually unlimited number of read voltage pulses at +2.0 volts because both the '1' and '0' states are stable under any voltage bias that is less than or equal to the +2.0 volt threshold.

Alternatively, the hysteresis at the negative end 320 of the I-V curve, which is characterized by a distinct region of negative resistance between −4.0 and −2.0 volts, can be used to read out the stored bit by applying a negative voltage pulse with a magnitude half that of the write '0' voltage while observing the current level through the device. In this case, −2.0 volts is applied. And as before, a high current magnitude indicates that the memory device is in the low-resistance '1' state, while low current magnitude indicates that that the memory device is in the high-resistance '0' state. The '0' state can be read out indefinitely at −2.0 volts. However, the '1' state is unstable at a continuous bias of −2.0 volts. The memory device can only be subjected to about a dozen read voltage pulses before the '1' state is converted to the more stable '0' state.

Figure 4:
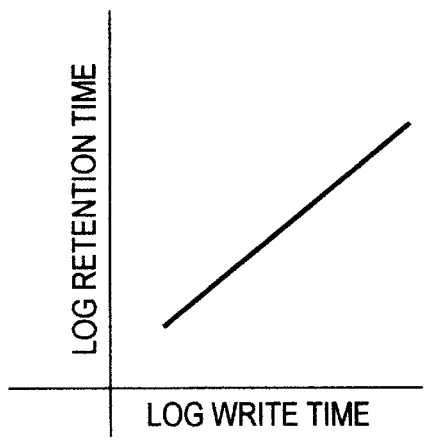
FIG. 4 is a log-log plot of write time vs. memory retention time for such a memory device.

Some generalizations can be made concerning the memory-retention behavior of the device illustrated in FIG. 1. The high-resistance '0' state is completely stable without applied bias over time. The '1' state, on the other hand, is generally unstable without applied bias voltage, asymptotically approaching the '0' state over time. With reference to FIG. 4, memory retention time in the low-resistance '1' state without the presence of an applied voltage or current source is dependent on the duration of the voltage pulse used during the write '1' procedure. A nearly linear relationship is found between duration of the write '1' voltage pulse and the resulting memory-retention time of the '1' state when write time and retention time are plotted on a log-log plot. Here we define "% hysteresis remaining" after some extended period of time Δt=X since the last write of a '1' bit to the memory device as:

$$\frac{(\text{current for read of '1' bit, time } t = X) - (\text{current for read of '0' bit})}{(\text{current for read of '1' bit, time } t = 0) - (\text{current for read of '0' bit})} \times 100\%$$

where it is assumed that "current for read of '0' bit" is stable at all times. In other words, "% hysteresis remaining" reflects how much of the original hysteresis remains after some period of time since the '1' bit was written to the memory device. Some representative memory retention results for various write times include: 10% of the original hysteresis remains after 1 min with 1 μs write time; 38% of the original hysteresis remains after 10 min with 40 μs write time; 68% of original hysteresis remains after 16 min with 120 μs write time; 25% of original hysteresis remains after 585 min with 24 ms write time; 5% of original hysteresis remains after 19080 min with 40 ms write time; 88% of original hysteresis remains after 4890 min with 1 second write time.

Figure 5:
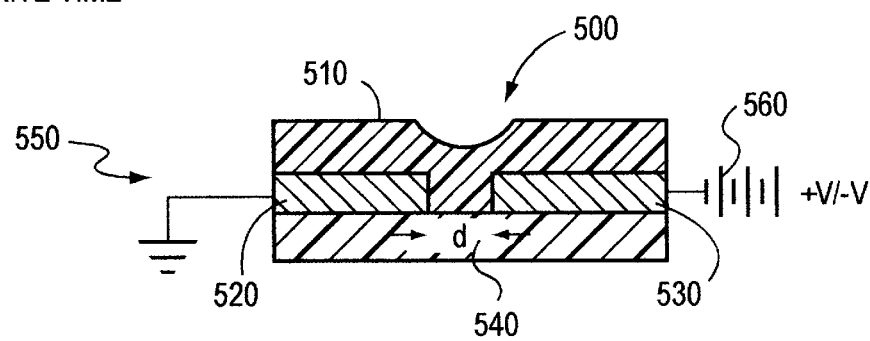
FIG. 5 shows a vertical cross-section through a memory device having a carbon-polymer memory film deposited to bridge the junction between two aluminum electrodes, arbitrarily illustrated in a coplanar configuration.

In a second embodiment of the invention illustrated in FIG. 5, the information-recording medium 500 is a carbon-based memory film disposed across two closely spaced, yet electrically isolated aluminum electrodes, here arbitrarily shown in a coplanar configuration. The separation d between the electrodes is preferably no more than 20 μm, and can be as small as a few nanometers. As shown in the figure, a carbon-in-polymer film 510 is thinly deposited to bridge the junction of an aluminum anode 520 and an aluminum cathode 530 which have been patterned onto an insulating substrate 540. Once again, the deposition of the film can be carried out by painting, screen printing, or other suitable means, and the carbon-in-polymer film is prepared and cured as described above in connection with FIG. 1.

Figure 6:
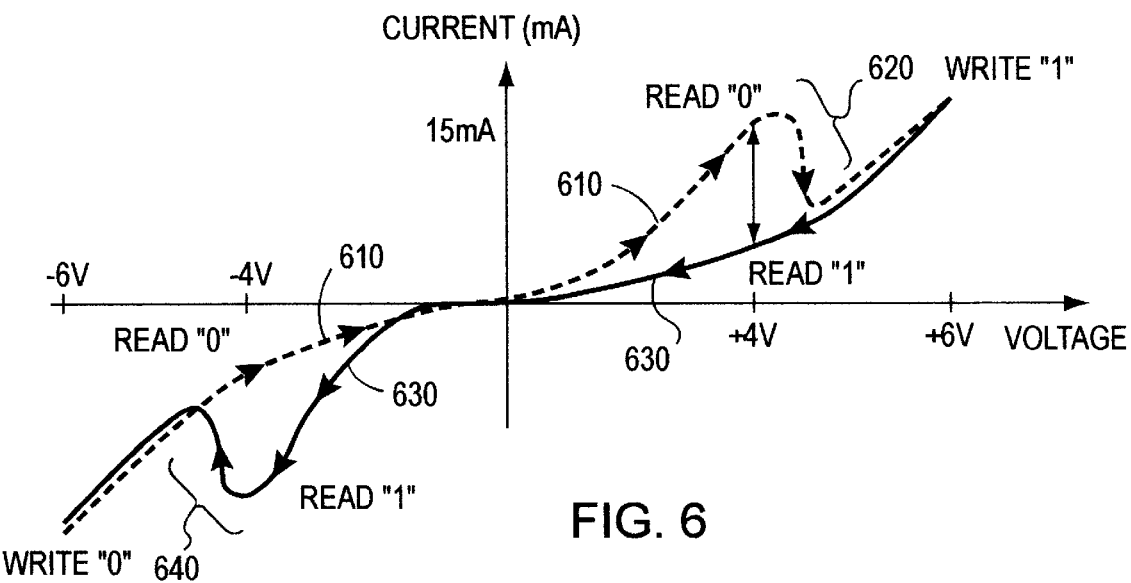
FIG. 6 shows a typical current-voltage curve and read/write operations for a memory device as shown in FIG. 5.

When the anode 520 is connected to ground (indicated at 550) and the cathode 530 is connected to a sweeping voltage source 560, the symmetric hysteresis curve shown in FIG. 6 is generated. The direction of the sweep path is indicated with arrows. As a matter of convention, the memory device can be said to be in the '0' state when its I-V curve is the upper dotted line 610 with arrows pointing from left to right. In the '0' state, the memory device exhibits high resistance at the negative end of the I-V curve, low resistance at the positive end, and negative resistance 610 at the far positive end of the I-V curve. Also as a matter of convention, the memory device can be said to be in the '1' state when its I-V curve is the lower solid line 630 with arrows pointing from right to left. When in the '1' state, the memory device exhibits low resistance at the negative end of the I-V curve, high resistance at the positive end of the I-V curve, and negative resistance 640 at the far negative end of the I-V curve.

Typical read-write operations for a representative memory device with the dual aluminum electrode configuration are also shown in FIG. 6. A '1' bit can be written to the memory element with a positive voltage step pulse of +6.0 volts for a specified duration (ranging from microseconds to milliseconds). Writing a '0' bit to the memory element is accomplished by applying a negative voltage pulse of −6.0 volts for a specified duration (again ranging from microseconds to milliseconds). Reading of the '1' or '0' state can be performed at either the positive end or the negative end of the hysteresis curve. Reading of the bit state at the positive end of the curve is accomplished by applying a positive voltage pulse of +4.0 volts while observing the current level through the device. High current indicates, according to our adopted convention, that a '0' has been stored, while low current indicates that a '1' has been stored (according to the same convention). At the negative end of the hysteresis curve, reading is accomplished by applying a negative voltage pulse of −4.0 volts while observing the current level through the device. Once again, high current indicates that a '0' has been stored, while low current indicates that a '1' has been stored.

A read voltage magnitude of −4.0 or +4.0 volts is chosen because the magnitude of the hysteresis is greatest at a potential that is typically about two-thirds that of the maximum write potential. Because the low-resistance state is unstable at the read potential, the memory device 500 can be subjected to only one or two read voltage pulses at either −4.0 or +4.0 volts before the low-resistance state is converted the high-resistance state. The high-resistance state, however, is persistently stable on both positive and negative ends of the I-V curve. Consequently, the memory device 500 can be subjected to a virtually unlimited number of read voltage pulses without conversion of the high-resistance state to the low-resistance state. In summary, if reading is conducted at the positive end of the hysteresis curve, the memory device can withstand an essentially unlimited number of reads of the '1' and only one or two reads of the '0' state; whereas if reading is conducted at the negative end of the hysteresis curve, the memory device can withstand an unlimited number of reads of the '0' state and only one or two reads of the '1' state.

The high-resistance state of the memory device shown in FIG. 5 is completely stable without applied bias over time. The low-resistance state, however, is generally unstable and asymptotically approaches the high-resistance state over time. The retention time of the low-resistance state (in the absence of an applied holding voltage or holding current source) depends on the duration of the voltage pulse used during the write procedure. But overall, retention times are very good, even when very short write pulses are used. Some representative memory retention results include: 73% of the original hysteresis remains after 1.3 h with 300 $\mu$s write time; 61% of original hysteresis remains after 14.6 h with 300 $\mu$s write time; 56% of original hysteresis remains after 52.0 h with 300 $\mu$s write time. For the above, the read pulse duration was also 300 $\mu$s.

In a third embodiment illustrated in FIG. 7, the information-recording medium 700 contains a semiconductor-in-polymer matrix. As shown in the figure, a conductive anode foil 710 (preferably aluminum, aluminized mylar, or copper) is coated with a layer of silver-in-polymer ink 720. This ink is preferably composed of micron-sized silver particles in a thermally curable vinyl chloride resin (Acheson Electrodag 725A, for example). Next, semiconductive particles (preferably highly doped) and a thermally curable vinyl chloride resin (Acheson Electrodag 23DD146A, for example) are mixed in a weight ratio ranging from 1:3 to 1:20. The semiconductor particulates may be, for example, jet-milled single crystal silicon doped with boron at a concentration greater than 20,000 parts per billion. This silicon-polymer matrix 730 is thinly deposited onto silver ink 720 (following curing thereof) by painting, screen printing, or other suitable means, and is then itself thermally cured in place. Finally, memory element 700 is completed by pressing a metal cathode probe 740 or conductive foil against the cured silicon-in-polymer matrix 730. Alternatively, the cathode can be a conductive ink of silver or other composition.

The current-voltage characteristics of device 700 are sensitive to the pressure applied to the silicon-polymer matrix 730 by the cathode 740. When the anode 710 is connected to ground (indicated at 750) and the cathode 740 connected to a sweeping voltage source 760, the hysteresis curve shown in FIG. 8 is generated. The direction of the sweep path is indicated with arrows. The high-resistance '0' state line 810 appears as a solid line with arrows pointing to the right, while the low-resistance '1' state line 820 appears as a dotted line with arrows pointing to the left. The switch from the high-resistance state to the low-resistance state is accomplished by exceeding a positive threshold voltage of about +2.0 volts across layers 720, 730, wherein positive voltage is defined in terms of the potential of the conducting substrate 710 relative to the grounded top contact 740. Maximum conversion to the low-resistance state is accomplished by driving the voltage to about twice the threshold value, i.e., about +4.0 volts. Maximum conversion from the low-resistance state to the high-resistance state is achieved by applying a negative voltage pulse of −4.0 volts. The large hysteresis at the positive end of the I-V curve is exploitable at potentials of less than 4 volts.

Representative read-write operations for a silicon-polymer memory device 700 also appear in FIG. 8. A '1' bit is written to the memory element with a positive voltage step pulse of +4.0 volts for a specified duration (ranging from microseconds to milliseconds). Writing a '0' bit to the memory element is accomplished by applying a negative voltage pulse of −4.0 volts for a specified duration (also ranging from microseconds to milliseconds). Reading of the '1' or '0' state is generally performed at the positive end of the I-V curve where maximum hysteresis may be exploited at low voltage potentials, and may be accomplished by applying a positive voltage pulse of +2.0 volts while observing the current level through the device. High current indicates the low-resistance state and, therefore, that a '1' has been stored, while low current indicates the high-resistance state characteristic of a stored '0'. A large hysteresis of over 42 mA at a +2.0 volt read potential, and impedance switching from 50 to 5000Ω, are common. Without applied bias, memory is retained at room temperature for about 30 min for write pulses of 2 ms duration. As expected, the low-resistance state is unstable and asymptotically approaches the more stable high-resistance state over time.

Any of the memory films described thus far can be incorporated into the construction of very dense two-dimensional and three-dimensional memory arrays. A planar two-dimensional array, indicated generally at 900, is shown in FIG. 9. The memory film layer 910 is sandwiched between a series of vertical address lines 920 on top and horizontal address lines 930 on the bottom. In such an array configuration, fully-functional memory elements representatively indicated at 940 are created at the intersections of every pair of vertical and horizontal address lines 920, 930, as shown by small dots. If required, a highly nonlinear film with a high "on-off" ratio, like a metal-insulator-metal diode film, can be laid down in series with the memory film to enhance address selectivity.

Because the memory structures of the present invention typically incorporate substantial amounts of flexible polymer, planar memory arrays can be fabricated on flexible substrates with suitably smooth surfaces such as KAPTON and MYLAR film, vinyl, and the like. The mechanical flexibility, low processing temperatures (less than 110° C.), and low manufacturing cost of the memory film material will allow memory arrays to be incorporated into novel devices including electronic paper, electronic books, and interactive clothing. For example, the digital information required to play back an audio sound clip can be stored in an all-printed memory film as disclosed herein and used, for example, to construct low-cost musical greeting cards and multimedia electronic paper.

It is believed that the dual conductance states of the memory films are due primarily to the reversible formation of conducting dendrites from one electrode to the other through the memory film. Because these dendrites can be as small as 10 nm in diameter, the ultimately achievable element density of a two-dimensional memory array is limited only by the metalization methods used to fabricate the conductive address lines. Many consumer products enjoy relatively large surface areas, for example, vast amounts of data can therefore be stored in low-cost two-dimensional memory arrays embedded in the surfaces of such products. Alternatively, the simple layer-by-layer construction of the memory elements lends itself the formation of three-dimensional stacked memory arrays. Because each layer can be only a few microns thick, a very large number of memory elements can be packed into a three-dimensional array that is no larger than an ordinary sugar cube.

The dual conductance states of the described carbon-in-polymer and silicon-in-polymer memory films can be used to great advantage in constructing reversibly programmable interconnects for some logic applications, particularly custom-configurable architectures. As shown in FIG. 10, a memory film 1000 can be disposed between a series of logic elements 1010, such as transistors. By applying voltage potentials of appropriate magnitude and polarity between the electrodes of the logic elements, any two logic elements 1010 within reasonable proximity to one another can be wired together via conducting interconnects or dendrites 1020 formed in the memory film. Consequently, a local network of arbitrary complexity can be formed on demand. Alternately, any interconnect 1020 can be "switched off" by application of a voltage potential of opposite polarity. Application of a voltage potential between two proximal interconnects 1020 may allow the formation of second- and perhaps even third-level connections between interconnects 1020.

Reversibly programmable interconnects of this type may be particularly useful for the construction of field-programmable gate array (FPGA) chips. A conventional FPGA uses between four and six resources to connect any two other resources. In other words, many more transistors, RAM, and EEPROM elements are devoted to simple wiring than are devoted to the active transistors and logic devices actually being wired. This makes for bulky and expensive chips with limited capabilities. A memory film crisscrossed with a network of user-programmable interconnects can fulfill the function of many of the elements typically used for programmable wiring in FPGA chips.

The non-volatile, biconductive properties of the memory films described herein allow them to function as interconnects, switches, and memory cells. Ultimately, the memory film may be instrumental toward the manufacture of devices that take advantage of defect-tolerant computer architectures, such as those suggested in Heath et. al., "A Defect-Tolerant Computer Architecture: Opportunities for Nanotechnology," *Science* 280:1716-21 (Jun. 12, 1998). Powerful, massively parallel computers can be constructed from only wires, switches, and memory. For example, if logic operations take the form of lookup tables, which are themselves constructed from arrays of selectively connected wires and switches, there is no need for traditional transistor-based logic gates. An entire computer may contain millions or billions of configurable bits formed by layers of address electrodes, memory film, and data electrodes. Because the memory film can support the formation of programmable interconnects between electrode layers in both planar and vertical directions, extremely dense three-dimensional stacked logic arrays can be created.

Although the present invention has been described with reference to specific details, it is not intended that such details should be regarded as limitations upon the scope of the invention, except as and to the extent that they are included in the accompanying claims.

What is claimed is:

1. A memory device including at least one element comprising:
   a. a pair of opposed electrodes; and
   b. intervening therebetween, a memory material comprising a polymer matrix having dispersed therein a particulate conductive or semiconductive material whereby application of a potential difference across the memory material causes it to hysteretically assume one of two detectable states.

2. The device of claim 1 wherein the two detectable states are a high-resistance state and a low-resistance state.

3. The device of claim 1 wherein the electrodes and the memory material are configured as a series of contiguous flat layers.

4. The device of claim 1 wherein the electrodes each have a surface and the electrodes and the memory material are configured in a coplanar configuration, at least a portion of the memory material intervening between the opposed electrode surfaces.

5. The device of claim 4 wherein the surfaces are separated by no more than 20 $\mu$m.

6. The device of claim 1 wherein the particulate material is selected from the group consisting of carbon, silicon, and silicon dioxide.

7. The device of claim 1 wherein the polymeric matrix is formed from a plastic resin selected from the group consisting of methacrylic resins, polyester resins, polycarbonate resins, vinyl chloride resins, polyamide resins, polyethylene resins, polypropylene resins, polystyrene resins, and silicone resins.

8. The device of claim 6 wherein the polymeric matrix is formed from a plastic resin, the particulate material being present in a weight ratio ranging from 1:3 to 1:10.

9. The device of claim 6 wherein the particulate material is silicon or silicon dioxide doped with boron at a concentration greater than 20,000 parts per billion.

10. The device of claim 1 wherein one of the electrodes is a conductive composite.

11. The device of claim 10 wherein the conductive composite is selected from the group consisting of silver in vinyl, silver in polyester, indium tin oxide in polyester, indium tin oxide in vinyl, carbon in vinyl, and carbon in polyester.

12. The device of claim 1 wherein one of the electrodes is metal.

13. The device of claim 12 wherein the metal is selected from the group consisting of aluminum, aluminum alloys, tantalum, and tantalum alloys.

14. The device of claim 1 wherein the particulate material is carbon and the polymer matrix is polyester, one of the electrodes is silver in vinyl, and the other electrode comprises aluminum metal.

15. The device of claim 1 wherein the particulate material is semiconductive, both of the electrodes comprise metal, and further comprising a silver-in-polymer material intervening between the memory material and one of the electrodes.

16. The device of claim 15 wherein the particulate material is silicon.

17. The device of claim 16 wherein the silicon is doped with boron.

18. The device of claim 1 wherein the particulate material comprises particles having an average size no greater than 50 $\mu$m.

19. The device of claim 3 wherein the potential difference necessary to cause the memory material to hysteretically assume one of the states is 4 volts.

20. The device of claim 4 wherein the potential difference necessary to cause the memory material to hysteretically assume one of the states is 6 volts.

21. The device of claim 3 wherein one of the electrodes comprises a first set of address lines running in a first direction and the other electrode comprises a second set of address lines running in a second direction perpendicular to the first direction, individually addressable memory elements being formed at the intersections of the first and second sets of address lines.

22. The device of claim 1 comprising a plurality of electrodes, various ones of the electrodes being proximate to other electrodes, at least some of the electrodes being associated with logic devices, application of the potential difference between two proximate electrodes establishing a connection between the logic devices associated therewith.

23. The device of claim 1 wherein one of the electrodes comprises a first set of address lines running in a first direction, and a second electrode comprises a second set of address lines running in a second direction perpendicular to the first direction, and further comprising a third electrode having a third set of address lines running in a third direction orthogonal to the first and second directions, individually addressable memory elements being formed at the intersections of any two or more address lines.

24. A method of fabricating the device of claim 3, the method comprising the steps of:
   a. depositing the memory material, in a flowable state, onto a metal or metalized electrode; and
   b. depositing the other electrode onto the memory material in a flowable state, the other electrode being a conductive composite.

25. A method of fabricating the device of claim 3, the method comprising the steps of:
   a. depositing the memory material, in a flowable state, onto a metal or metalized electrode;
   b. depositing, onto the memory material, a conductive composite; and
   c. contacting the conductive composite with a second metal or metalized electrode.

26. The method of claim 24 wherein the depositing steps are performed by one of screen printing, block printing, painting, spin coating, and jetting.

27. The method of claim 25 wherein the depositing steps are performed by one of screen printing, block printing, painting, spin coating, and jetting.

* * * * *